United States Patent
Ishii et al.

(10) Patent No.: US 11,482,143 B2
(45) Date of Patent: Oct. 25, 2022

(54) MEMS DISPLAY DEVICE WITH AUTO-INSPECTION MECHANISM

(71) Applicant: IGNITE, Inc., Tokyo (JP)

(72) Inventors: Fusao Ishii, Pittsburgh, PA (US); Victor Stone, Pittsburgh, PA (US); Toshitaka Torikai, Sagamihara (JP)

(73) Assignee: IGNITE, Inc., Tokyo (JP)

( * ) Notice: Subject to any disclaimer, the term of this patent is extended or adjusted under 35 U.S.C. 154(b) by 0 days.

(21) Appl. No.: 17/258,010

(22) PCT Filed: Sep. 20, 2019

(86) PCT No.: PCT/US2019/052158
§ 371 (c)(1),
(2) Date: Jan. 5, 2021

(87) PCT Pub. No.: WO2020/061455
PCT Pub. Date: Mar. 26, 2020

(65) Prior Publication Data
US 2021/0280105 A1    Sep. 9, 2021

Related U.S. Application Data

(60) Provisional application No. 62/733,782, filed on Sep. 20, 2018.

(51) Int. Cl.
*G09G 3/00* (2006.01)
*G01R 31/28* (2006.01)
*G02B 26/08* (2006.01)

(52) U.S. Cl.
CPC ......... *G09G 3/006* (2013.01); *G01R 31/2825* (2013.01); *G02B 26/0841* (2013.01); *G09G 2330/10* (2013.01); *G09G 2330/12* (2013.01)

(58) Field of Classification Search
CPC .............. G09G 3/006; G09G 2330/10; G09G 2330/12; G01R 31/2825; G02B 26/0841;
(Continued)

(56) References Cited

U.S. PATENT DOCUMENTS

2006/0065043 A1   3/2006   Cummings
2009/0189720 A1   7/2009   Debarnot et al.
(Continued)

FOREIGN PATENT DOCUMENTS

CN         102854196 A     1/2013

*Primary Examiner* — Mark W Regn
(74) *Attorney, Agent, or Firm* — Young Basile Hanlon & MacFarlane, P.C.

(57) ABSTRACT

A Micro-Electro-Mechanical Systems (MEMS) device includes a substrate, an electronic circuit mounted on the substrate, a movable element mounted on the substrate whose movement is controlled by application of an operating voltage by the electronic circuit, a stopper mounted on the substrate that stops the movement of the movable element through mechanical contact of the stopper with the movable element, and an auto-inspection mechanism that applies a test voltage between the movable element and the stopper and determines whether or not a leak current is present. The auto-inspection mechanism is mounted, at least in part, on the substrate. The test voltage is lower than the operating voltage.

16 Claims, 5 Drawing Sheets

(58) Field of Classification Search
CPC ........ B81B 2203/058; B81B 2201/042; B81C 99/0045
See application file for complete search history.

(56) References Cited

U.S. PATENT DOCUMENTS

| | | | |
|---|---|---|---|
| 2010/0033799 A1* | 2/2010 | Pan | G02B 26/101 |
| | | | 359/291 |
| 2012/0194207 A1* | 8/2012 | Vaganov | G06F 3/0338 |
| | | | 324/750.01 |
| 2018/0095267 A1* | 4/2018 | Payne | G02B 5/0825 |
| 2018/0186624 A1* | 7/2018 | Hsu | B81B 3/0086 |

* cited by examiner

MEMS DISPLAY DEVICE WITH AUTO-INSPECTION MECHANISM

CROSS-REFERENCE TO RELATED APPLICATION

This application claims priority to and the benefit of U.S. Provisional Application Patent Ser. No. 62/733,782, filed Sep. 20, 2018, the entire disclosure of which is hereby incorporated by reference.

TECHNICAL FIELD

This invention relates to a micro-electro-mechanical systems (MEMS) display device having an inspection system that inspects a pixel array of the MEMS display device.

BACKGROUND

Recent display devices often require a large number of pixels such as two million pixels for high-definition televisions (HDTV) and even eight million pixels for so-called 4K displays. However, the inspection of these devices to check whether each of the pixels is properly functioning or not is difficult due to the large number of pixels. Visual inspection systems have been developed. However, they are not necessarily effective because such an inspection system requires a dark room and a high-resolution vision system, complicated software, and a human inspector to operate the system with a final visual check.

SUMMARY

The present disclosure enables a display device to be automatically tested. A self-checking mechanism may be built in the display device to provide the exact addresses of defective pixels. Such addresses are very useful information for yield improvement.

A MEMS device, such as a MEMS display device, includes a substrate, an electronic circuit on the substrate, a movable element on the substrate whose movement is controlled by the application of an operating voltage by the electronic circuit, a stopper that stops the movement of the movable element through mechanical contact of the stopper with the movable element, and an auto-inspection mechanism that applies a test voltage between the movable element and the stopper and determines whether or not a leak current is present. The movable element may comprise a mirror element that is a pixel of a display.

Variations in this MEMS device and other MEMS devices are described below in additional detail.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity. Further, like reference numbers refer to like elements unless otherwise noted.

DETAILED DESCRIPTION

Figure 1:
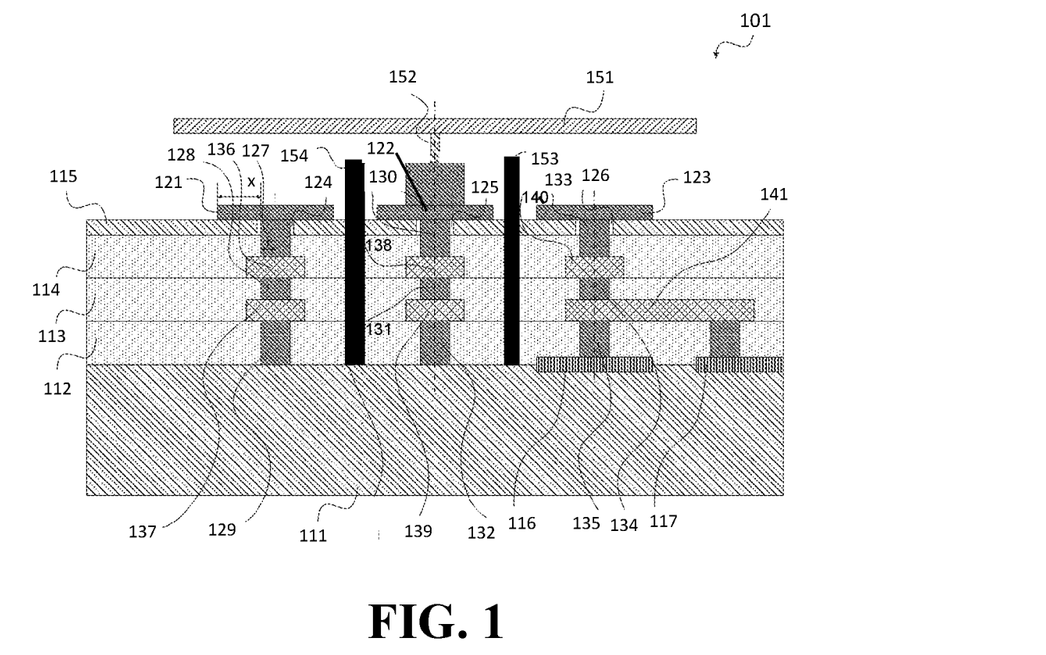
FIG. 1 is a cross-sectional diagram of a MEMS device that can be used in a display device according to a first embodiment.
Figure 2:
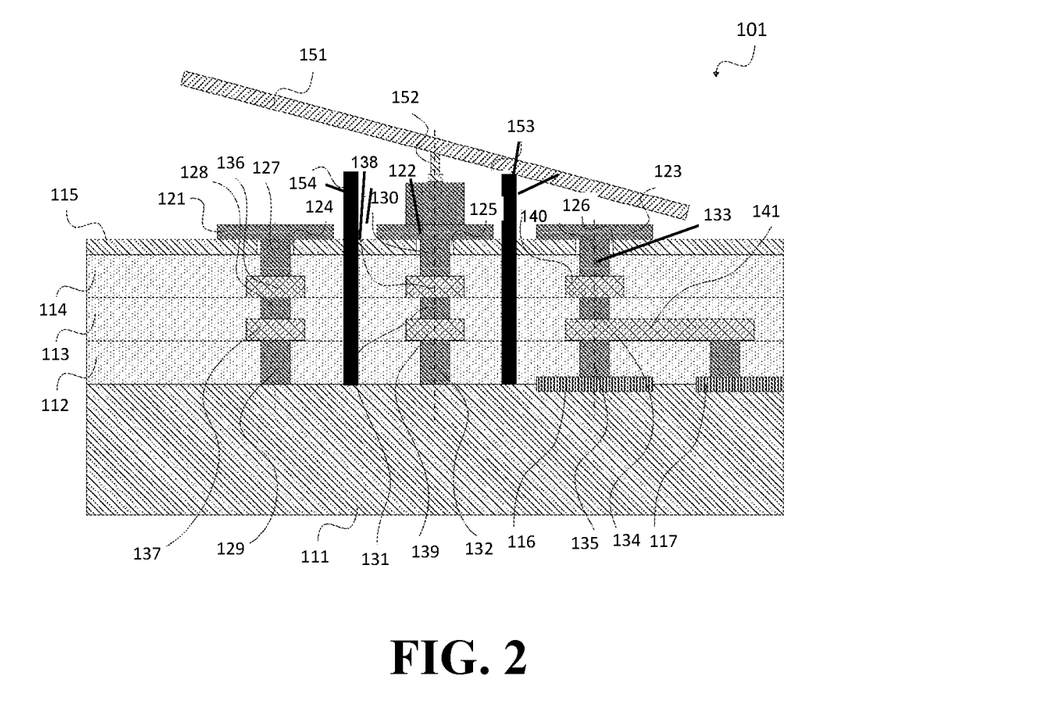
FIG. 2 is a cross-sectional diagram when a mirror of the MEMS device in FIG. 1 is deflected to an ON state.

FIGS. 1 and 2 show a cross-sectional view of a MEMS device 101 in a first embodiment of this disclosure. These figures and others herein are used to describe a single movable element of a MEMS device according to this disclosure. However, the MEMS devices described herein may include multiple movable elements. Where the movable element is a mirror such that the MEMS device is used in a display, for example, the MEMS device may include millions of mirrors (e.g., arranged in an array) in some implementations. The MEMS device 101, or its mirror/mirror element, may also be referred to as a micromirror or a pixel of a display device herein.

The MEMS device 101 includes a substrate 111. At least one electronic circuit is formed on the substrate 111, which in this example is one or more transistors 116, 117 that may be used to apply an operating voltage for switching of the MEMS device 101 as described below. Inter-layer dielectrics 112, 113, 114 are formed on the substrate 111. Namely, the inter-layer dielectric 112 is formed on the substrate 111 and portions of the electronic circuits, here the transistors 116, 117. The inter-layer dielectric 113 is formed on the inter-layer dielectric 112, and the inter-layer dielectric 114 is formed on the inter-layer dielectric 113. More or fewer inter-layer dielectrics may be incorporated. An inter-layer dielectric may also be referred to herein as an insulating layer. An etch stop layer 115 formed on the (e.g., top) inter-layer dielectric 114 that is layered furthest from the substrate.

The MEMS device 101 has metal layers 136, 137, 138, 139, 140, 141 and electrodes 121, 122, 123 for electrical wiring between the inter-layer dielectrics 112, 113, 114. Also, the MEMS device 101 has vias 127, 128, 129, 130, 131, 132, 133, 134, 135 connecting electrical wirings and electrodes. More generally, the MEMS device 101 can include one or more electrodes mounted on the etch stop layer 115 for electrical connection with the one or more electronic circuits of the MEMS device 101 through metal layers and vias insulated using the inter-layer dielectrics. The number of electrodes, metal layers, and vias of a MEMS device according to the teachings herein can vary based on the electronic circuits within the MEMS device 101 and their arrangements therein.

As shown in FIG. 1, the via 127 provides a conductive path through the inter-layer dielectric 114 from the electrode 121, which is formed on the etch stop layer 115, to the metal layer 136, which is formed on the inter-layer dielectric 114. The via 128 provides a conductive path through the interlayer dielectric 113 from the metal layer 136, which is formed on the inter-layer dielectric 114, to the metal layer 137, which is formed on the inter-layer dielectric 112. The via 129 provides a conductive path through the inter-layer dielectric 112 from the metal layer 137, which is formed on the inter-layer dielectric 112, to the substrate 111. Through the vias 127, 128, 129 and the metal layers 136, 137, the electrode 121 may be electrically wired or connected to electronic circuits with contacts on the substrate 111, the inter-layer dielectric 113, and the inter-layer dielectric 114.

In a similar manner, the via 130 provides a conductive path through the inter-layer dielectric 114 from the electrode 122, which is formed on the etch stop layer 115, to the metal layer 138, which is formed on the inter-layer dielectric 114. The via 131 provides a conductive path through the inter-layer dielectric 113 from the metal layer 138, which is formed on the inter-layer dielectric 114, to the metal layer 139, which is formed on the inter-layer dielectric 112. The via 132 provides a conductive path through the inter-layer dielectric 112 from the metal layer 139, which is formed on the inter-layer dielectric 112, to the substrate 111. Through the vias 130, 131, 132 and the metal layers 138, 139, the electrode 122 may be electrically wired or connected to electronic circuits with contacts on the substrate 111, the inter-layer dielectric 113, and the inter-layer dielectric 114.

Connections of an electrode with an electronic circuit are shown in FIG. 1 with reference to the connection of the electrode 123 to contacts for one or more transistors 116, 117. The via 133 provides a conductive path through the inter-layer dielectric 114 from the electrode 123, which is formed on the etch stop layer 115, to the metal layer 140, which is formed on the inter-layer dielectric 114. The via 134 provides a conductive path through the inter-layer dielectric 113 from the metal layer 140, which is formed on the inter-layer dielectric 114, to the metal layer 141, which is formed on the inter-layer dielectric 112. The vias 135 provide respective conductive paths through the inter-layer dielectric 112 from the metal layer 141, which is formed on the inter-layer dielectric 112, to the contacts of the one or more transistors 116, 117. Through the vias 133, 134, 135 and the metal layers 140, 141, the electrode 123 may also be electrically wired or connected to electronic circuits with contacts on the inter-layer dielectric 113, and the inter-layer dielectric 114.

Further, the MEMS device 101 has a hinge 152 formed on the electrode 122 directly or on an additional conductive support structure mounted on the electrode 122, where the conductive support as shown in each of the figures by example may be formed of the same material as the electrode 122. The MEMS device 101 has a mirror element 151 formed on the upper side of the hinge 152. In this embodiment and the others described herein, the mirror element is one example of a movable element that may be incorporated into the MEMS device.

The substrate 111 is composed of single crystal silicon. The transistors 116 and 117 are complementary metal-oxide semiconductor (CMOS) transistors in this example, but other electronic circuits are possible. The inter-layer dielectrics 112, 113, 114 are interlayer insulating films or layers including silicon, alumina, silicon dioxide ($SiO_2$), Aluminum nitride, or another appropriate insulating material or combination of insulating materials.

The metal layers 136, 137, 138, 139, 140, 141 are made of, for example, aluminum (Al), copper (Cu), or an aluminum copper alloy (Al—Cu).

The electrodes 121, 122, 123 are made of tungsten (W) or the same material as the vias. Each of the vias 127, 128, 129, 130, 131, 132, 133, 134, 135 is formed as a through-hole that extends through at least one layer of the MEMS device 101 and is filled with a conductive material, tungsten (W) in this example. In addition, gaps 124, 125, and 126 may be formed between the vias 127, 130, 133 and the etch stop layer 115 during manufacturing that result in problems in the manufacturing method because a subsequently-used etchant may penetrate these gaps and damage the structures. To mitigate this problem, and assuming that the radius of the via 127 is r, it is desirable that the relationship of the distance x over which the electrode 121 covers the etch stop layer 115 is more than twice r. This same relationship between the radius r of a via through an etch stop layer and the length or distance x of an electrode mounted on the etch stop layer is desirable for each electrode mounted on the etch stop layer.

In a structure herein where an electrode, such as the electrode 122, is mounted on the etch stop layer, such as the etch stop layer 115, the relationship is described above as the distance x over which the electrode covers the etch stop layer is more than twice r. In other structures described herein, e.g., FIGS. 3 and 6, the etch stop layer may instead cover the some or all of the electrode. More generally, the electrode may be described as having a length, a size or a dimension (e.g., a length, a width, or a radius) along the surface upon which it is mounted that is at least twice the radius of the via with which it is electrically connected.

That is, for example, is desirable that the electrodes 121, 122, 123 covering the etch stop layer 115 have a size that is twice or more the radius of the via connected to each. This prevents the vapor etchant from (i) penetrating the electrodes 121, 122, 123 and the etch stop layer 115 and (ii) eroding the inter-layer dielectric 114 through the gaps 124, 125, 126.

The hinge 152 is a deformable member that supports the mirror element 151. The hinge 152 is made of a material such as amorphous silicon or poly-silicon, for example.

The mirror element 151 is a member capable of reflecting light from light sources. The mirror element 151 may have a support layer composed of titanium, tungsten, or the like, and a mirror layer composed of a material with good reflectivity, such as aluminum, gold, or silver, or any combination thereof. A back side of the mirror element (e.g., a bottom surface facing the stopper) may have a light absorbing coating, such as TiN.

The mirror element 151 is electrostatically attracted to the electrode 123, and the hinge 152 tilts due to deformation. This may result from applying a voltage between the movable element (e.g., the mirror element 151) and the electrode 123 by an electronic circuit (e.g., through a trace on the substrate 111 and/or other combination of electrical connections including in this example one or more of the transistors 116, 117). The voltage causes the attractive force. The voltage applied by the electronic circuit may be, for example, between about 20 and 30 volts, inclusive. This position (shown in FIG. 2 described below) may be referred to as an ON state of the mirror element 151 or of the MEMS device 101.

One or more mechanical stoppers 153, 154 extend through the etch stop layer 115 towards the (e.g., bottom) surface of the mirror element 151. In this example, two mechanical stoppers 153, 154 are located on opposite sides of the hinge 152 relative to the plane of the substrate 111. However, one or more than two may be included. The mechanical stopper 153, 154 as shown is a single piece that extends perpendicular to the default or unexcited position of the mirror element 151, which is in turn in parallel with a mounting surface of the substrate 111 and its layers. The mechanical stopper 153, 154 may be formed of the same material as the hinge 152. The mechanical stopper 153, 154 may be made of at least one of Tungsten, Copper, Silicon, Titanium, or Titanium-Nitride. The material of the mechanical stopper 153, 154 is not particularly limited so long as it can conduct current when subject to an applied voltage as described below, and has a yield strength that is larger than the stress applied by the movable element (here, the mirror element 151) with which it collides due to deformation of the hinge 152. In this example and others, stoppers are shown mounted directly on the substrate, but the stoppers may not extend all the way to the substrate, and instead may be coupled to the auto-inspection mechanism described below through traces, vias, metal layers, or any combination thereof.

As shown in FIG. 2, the mirror element 151 is prevented from contact with the electrode 123, which is not covered with an insulating layer, by contacting the stopper 153. Alternatively or additionally, the mirror element 151 is prevented from contact with the electrode 121, which is not covered with an insulating layer, by contacting the stopper 154. That is, more generally, the mechanical stopper 153, 154 is mounted at a height above the electrodes 121, 123 sufficient to prevent deformation of the hinge 152 from causing the mirror element 151 to tilt far enough to contact any other portion of the MEMS device. This makes it possible to, for example, prevent an electrical short circuit. A stopper, such as the stopper 153 or 154, can extend perpendicularly from a top layer of the substrate 111. The height and/or width of the stopper may depend on the distance of the stopper from the hinge 152 along the plane of the top layer, the size (e.g., the diameter) of the mirror element 151, the distance of the electrodes or other structures on top of the layers of the substrate 111, or some combination of these features. A distance between the stopper 153, 154 and the hinge 152 of a mirror element 151 may be less than one-half a distance between the hinge 152 and an outer peripheral edge of the mirror element 151. Where the mechanical stopper 153, 154 is formed of the same material as the hinge 152, the mechanical stopper 153, 154 may also deform slightly, but this deformation may be ignored, or may be considered in determining the height and, in some cases the width, of the mechanical stopper 153, 154.

Figure 3:
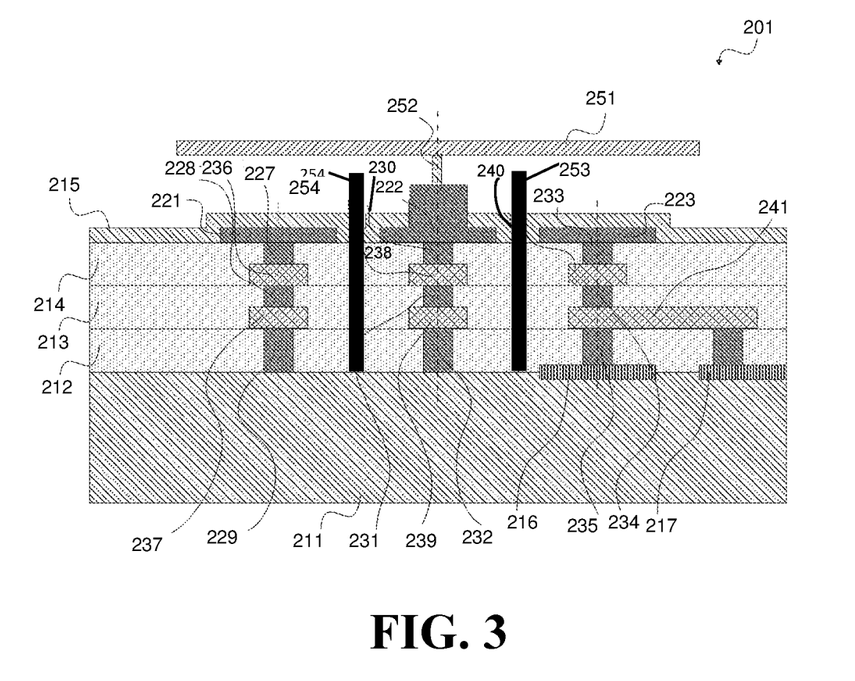
FIG. 3 is a cross-sectional diagram of a MEMS device that can be used in a display device according to a second embodiment.

FIG. 3 shows a cross-sectional view of a MEMS device 201 in a second embodiment of this disclosure. The MEMS device 201 includes a substrate 211. At least one electronic circuit is formed on the substrate 211, which in this example is one or more transistors 216, 217. Like the transistors 116, 117 of FIGS. 1 and 2, the transistors 216, 217 may be CMOS transistors, or some other electronic component or circuit that may be used to apply an operating voltage for switching of the MEMS device 201. Inter-layer dielectrics 212, 213, 214 are formed on the substrate 211. Namely, the inter-layer dielectric 212 is formed on the substrate 211 and portions of the electronic circuits, here the transistors 216, 217. The inter-layer dielectric 213 is formed on the inter-layer dielectric 212, and the inter-layer dielectric 214 is formed on the inter-layer dielectric 213. More or fewer inter-layer dielectrics may be incorporated, and the inter-layer dielectrics 212, 213, 214 may be formed of the same material as the inter-layer dielectrics 112, 113, 114. An etch stop layer 215 formed on the (e.g., top) inter-layer dielectric 214 that is layered furthest from the substrate.

Further, the MEMS device 201 has metal layers 236, 237, 238, 239, 240, 241 and electrodes 221, 222, 223 for electrical wiring between the inter-layer dielectrics 212, 213, 214. Also, the MEMS device 201 has vias 227, 228, 229, 230, 231, 232, 233, 234, 235 connecting electrical wirings and electrodes. The vias 227, 228, 229, the metal layers 236, 237, and the electrode 221 may be formed in the same arrangements and of the same materials as the vias 127, 128, 129, the metal layers 136, 137, and the electrode 121 respectively, as described above. The vias 230, 231, 232, the metal layers 238, 239, and the electrode 222 may be formed in the same arrangements and of the same materials as the vias 130, 131, 132, the metal layers 138, 139, and the electrode 122, respectively, as described above. The vias 233, 234, 235, the metal layers 240, 241, and the electrode 223 may be formed in the same arrangements and of the same materials as the vias 133, 134, 135, the metal layers 140, 141, and the electrode 123, respectively, as described above.

The MEMS device 201 has a hinge 252 formed on the electrode 222 directly or on a separate electrode mounted on the electrode 122, and a mirror element 251 formed on the upper side of the hinge 252. The hinge 252 may be formed in the same way and using the same material as the hinge 152, and the mirror element 251 may be the same as the mirror element 151 described above. One or more mechanical stoppers 253, 254 are included. The mechanical stopper 253 may be arranged and sized similarly to the mechanical stopper 153. The mechanical stopper 254 may be arranged and sized similarly to the mechanical stopper 154.

The electrodes 221, 222, 223 are made of Al, an Al—Cu alloy, or the like. The electrodes 221, 222, 223 are formed on the inter-layer dielectric 214. The electrodes 221, 222, 223 form a step with the inter-layer dielectric 214. In contrast to the arrangement of FIGS. 1 and 2 wherein the etch stop layer 115 covers the inter-layer dielectric 114, and the electrodes 121, 122, 123 are formed on the etch stop layer 115, in this embodiment the etch stop layer 215 covers the electrodes 221, 222, 223 and the inter-layer dielectric 214 in a stepped manner. A major difference between the second embodiment and the first embodiment is that the etch stop layer 215 covers the electrodes 221, 222, 223.

The mirror element 251 is electrostatically attracted to the electrode 223 and the hinge 252 tilts due to deformation using a voltage applied by an electronic circuit similarly to that described with regards to FIG. 1. Like the first embodiment, the mirror element 251 is restricted in inclination by contact with the stopper 253, the stopper 254, or both the stoppers 253 and 254, depending on the applied voltage. The mirror element 251 is prevented from contact with the etch stop layer 215 that overlays the electrode 223. The etch stop layer 215 prevents the mirror element 251 from directly contacting the electrode 223. Because the etch stop layer 215 is an insulating film composed of Aluminum nitride (AlN) or Aluminum oxide ($Al_2O_3$), an electrical short circuit can be prevented.

Figure 4:
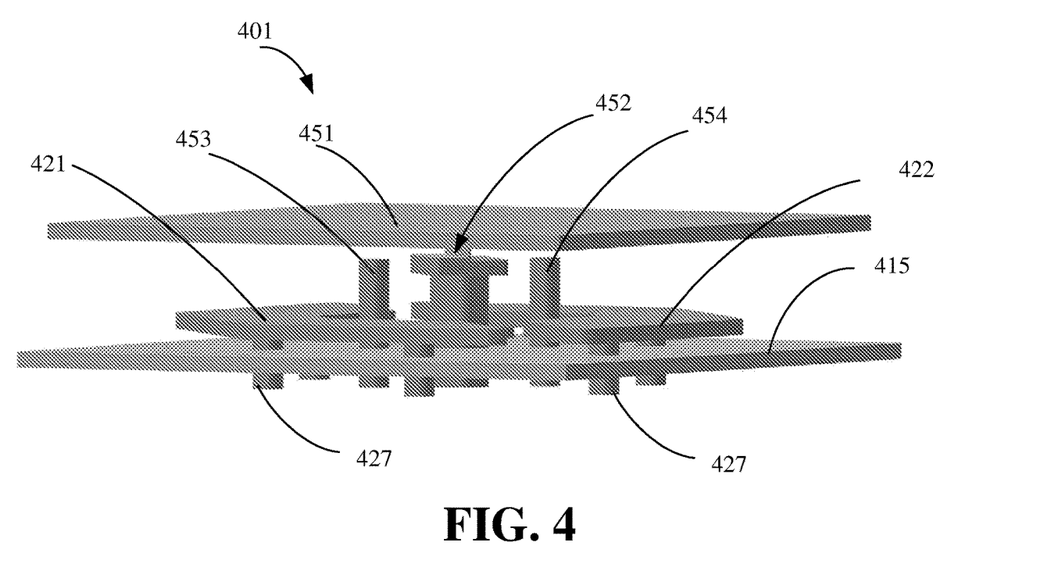
FIG. 4 is a simplified perspective view of a MEMS device that can be used in a display device according to a third embodiment.

FIG. 4 is a simplified perspective view of a MEMS device 401 according to a third embodiment of this disclosure. FIG. 4 is simplified because only certain elements of the MEMS device 401 are shown. The MEMS device 401 is a variation of the MEMS device 101. The substrate and any inter-layer dielectrics are omitted, as are any electronic circuits, such as the transistors, that are used to control the movement of the movable element of the MEMS device by the application of the operating voltage. The elements of the MEMS device 401 shown in FIG. 4 include two electrodes 421, 422. The electrodes 421, 422 may be formed of one or more materials used to form the electrodes described above, such as the electrodes 121, 122, 123. The electrodes 421, 422 may be mounted directly atop an etch stop layer such as in the MEMS device 101 of FIG. 1. In this example, however, the electrodes 421, 422 are mounted spaced apart from an etch stop layer 415 by an inter-layer dielectric such as the inter-layer dielectrics 112, 113, 114 of FIG. 1 (not shown in FIG. 4). The etch stop layer 415 may be formed on another inter-layer dielectric layered on the substrate. The etch stop layer 415, like the etch stop layers described previously, protects the structure under the etch stop layer 415 against the etching of sacrificial layers above the etch stop layer 415 during fabrication (manufacture, construction, etc.) of the MEMS device 401.

The MEMS device 401 has multiple vias 427, only two of which are labeled in FIG. 4. The vias 427 may be formed of the same material as the vias described above, such as the vias 127, 128, 129, 130, 131, 132, 133, 134, 135 of FIG. 1. The vias 427 connect electrical wirings and electrodes. For example, the vias 427 electrically connect the electrodes 421, 422 to metal layers (such as metal layers 136, 137, 138, 139), electronic circuits (such as one or more transistors 116, 117), or both, that under the etch stop layer 415.

Further, the MEMS device 401 has a hinge 452. The hinge 452 may be formed on an electrode either directly or on an additional conductive support structure mounted on the electrode (for example, as shown by the electrode 122 and hinge 152 of FIG. 1), or may be formed on a via, such as a via 427, extending through the etch stop layer 415. A mirror element 451 is formed on the upper side of the hinge 452. The mirror element 451 may comprise the same material as the mirror elements 151, 251. Also shown in FIG. 4 are stoppers 453, 454. The stoppers 453, 454 may be formed of the same materials as the stoppers 153, 154. The stoppers 453, 454 may be formed at a location relative to the hinge 452 and electrodes 421, 422 and to a height as described above—that is, so that the mirror element 451 is prevented from contact with the electrode 421 by contacting the stopper 153, the mirror element 451 is prevented from contact with the electrode 422 by contacting the stopper 454, or both.

Figure 5:
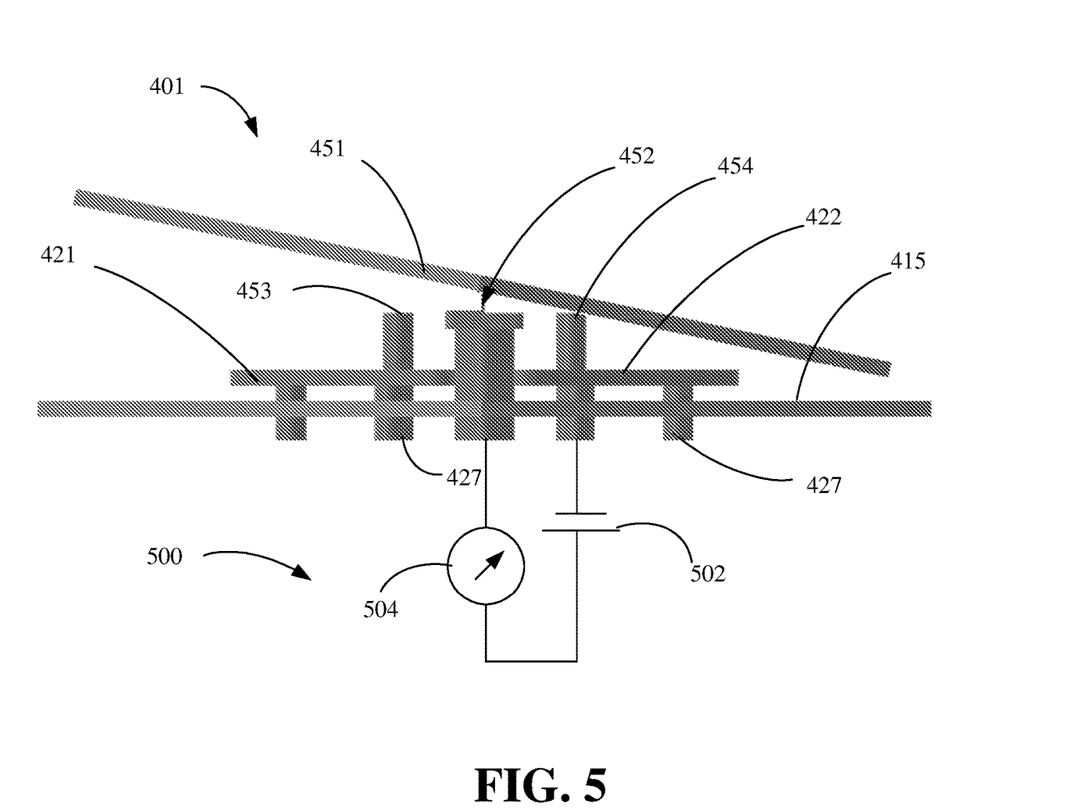
FIG. 5 is a simplified side view when a mirror of the MEMS device in FIG. 4 is deflected to an ON state.

FIG. 5 is a simplified side view when the mirror element 451 of the MEMS device 401 in FIG. 4 is deflected to an ON state. That is, a state where the operating voltage applied between the mirror element 451 and one of the electrodes 421, 422 by an electronic circuit results in deflection of the hinge 452. In this example, the stopper 454 prevents the mirror element 451 from contact with the electrode 422.

FIG. 5 also shows an example of an auto-inspection mechanism 500 coupled to the mirror element 451 when the mirror element 451 is tilted by an electrostatic force from its electrode and stopped at a stopper, the stopper 454 in this example. The auto-inspection mechanism 500 includes a voltage source and a current detection device that detects current but may also be a current-measurement device that measures the current. In this example, a voltage is applied by a battery 502, and current is measured by an ampere meter 504.

Figure 6:
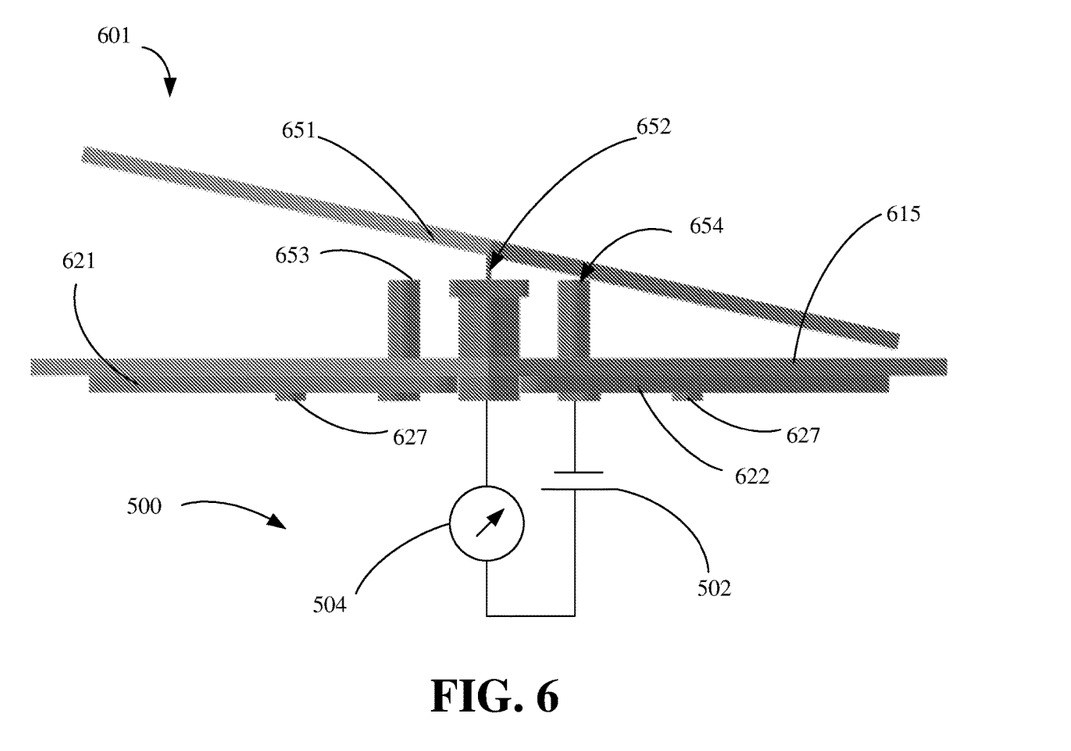
FIG. 6 is a simplified side view of a MEMS device that can be used in a display device according to a fourth embodiment, where a mirror of the MEMS device is deflected to an ON state.

The same portion of the auto-inspection mechanism 500 may also be seen with reference to FIG. 6, which is a simplified side view of a MEMS device 601 according to a fourth embodiment, where a mirror element 651 of the MEMS device 601 is deflected to an ON state. The MEMS device 601 is a variation of the MEMS device 201. That is, the MEMS device 601 includes a substrate (similar to the substrate 211), one or more inter-layer dielectrics (similar to the inter-layer dielectrics 212, 213, 214), one or more electronic circuits (such as transistors similar to the transistors 216, 217), and one or more metal layers (similar to metal layers 236, 237, 238, 239, 240, 241). These elements are not shown in FIG. 6 for clarity.

The MEMS device 601 is also similar to the MEMS device 201 of FIG. 3 in that the MEMS device 601 includes one or more electrodes, here at least two electrodes 621, 622. An etch stop layer 615, like the etch stop layer 215, protects the structure under the etch stop layer 615 against the etching of sacrificial layers above the etch stop layer 615 during fabrication (manufacture, construction, etc.) of the MEMS device 601. The electrodes 621, 622 may be formed of one or more materials used to form the electrodes described above, such as the electrodes 221, 222, 223. Like the structure of the MEMS device 201, the electrodes 621, 622 are below the etch stop layer 615. In this example, however, the electrodes 621, 622 may be embedded into an inter-layer dielectric such as the inter-layer dielectric 214 of FIG. 2 (not shown in FIG. 4), so as to form a flat (smooth, contiguous, planar, etc.) surface. The etch stop layer 615 is then formed over the electrodes 621, 622 and the surrounding inter-layer dielectric.

By embedding the electrodes under the etch stop layer, which is electrical insulator, the structures of FIGS. 3 and 6 have an advantage over the structures of FIGS. 1 and 4 in that there is lesser chance of shortage between electrodes and mirrors. Further, there may be fewer process steps in manufacture.

The MEMS device 601 has multiple vias 627, only two of which are labeled in FIG. 6. The vias 627 may be formed of the same material as the vias described above, such as the vias 227, 228, 229, 230, 231, 232, 233, 234, 235 of FIG. 1. The vias 627 connect electrical wirings and electrodes. For example, the vias 627 electrically connect the electrodes 621, 622 to metal layers (such as metal layers 236, 237, 238, 239), electronic circuits to control operation of the MEMS device 601 (such as one or more transistors 216, 217), or both, that are under the etch stop layer 615.

Further, the MEMS device 601 has a hinge 652. The hinge 652 may be formed on an electrode either directly or on an additional conductive support structure mounted on the electrode (for example, as shown by the electrode 222 and hinge 252 of FIG. 3), or may be formed on a via, such as a via 627, extending through the etch stop layer 615. A mirror element 651 is formed on the upper side of the hinge 652. The mirror element 651 may comprise the same material as the mirror elements 151, 251. Also shown in FIG. 6 are stoppers 653, 654. The stoppers 653, 654 may be formed of the same materials as the stoppers 253, 254. The stoppers 653, 654 may be formed at a location relative to the hinge 652 and electrodes 621, 622 and to a height as described above—that is, so that the mirror element 651 is prevented from contact with the etch stop layer 615.

The simplified side view of FIG. 6 shows the mirror element 651 of the MEMS device 601 deflected to an ON state. That is, a state where a voltage applied across the mirror element 651 and an electrode by an electronic circuit (such as the transistors and connected electronics described above) results in deflection of the hinge 652. In this example, the stopper 654 prevents the mirror element 651 from contact with the electrode 622.

The OFF state of any of the embodiments is where the mirror element 151, 251, 451, or 651, is not in contact with a stopper. For example, the unexcited state where the mirror element 151, 251, 451, 651 is substantially parallel with the substrate and its layers such as shown in the arrangement of FIGS. 1 and 4 corresponds to an OFF state.

As seen by reference to FIGS. 2, 4, and 6, a mirror is tilted by an electrostatic force (e.g., from an electrode) with the operating voltage deforming a hinge, the mirror contacts a stopper, and the mirror stops its rotation about the hinge.

When the operating voltage is removed, the mirror should move back to the neutral position (the OFF state) by the mechanical force of the hinge. However, defective pixels (e.g., individual movable elements of the MEMS devices) caused by contamination, a broken hinge, and so on, will result in the movable element (e.g., a mirror element) being unable to return to the neutral position. When the mirror cannot move, the MEMS device is defective.

It would be desirable for the defective MEMS device to be detected. This is desirable at initial factory inspection. Further, some applications, such as automobile display applications, may require real-time inspection. During normal operations, the potential of the stopper is the same as that of the mirror. At a time when no operating voltage is applied between the mirror and the electrodes (i.e., when the MEMS device is supposed to be in the OFF state), application of a test voltage between the mirror and the stopper can be used to check whether leak current exists. The test voltage should be lower than the operating voltage so as not to cause a hinge to deform and move the mirror, but high enough to result in a measurable leak current in the event of a short. That is, if leak current exists, the mirror is likely stuck to the stopper through at least one point of contact. This occurs because the mirror and the stopper are no longer at the same potential upon application of the test voltage. The presence of leak current during the OFF state indicates that the MEMS device is defective. The test voltage may be, in some examples, between about 0.5 and 1 volt, inclusive.

An auto-inspection mechanism that can be used for this testing includes a voltage source and a current-detecting device (e.g., a current-measurement device). In the example of FIGS. 5 and 6, the auto-inspection mechanism 500 includes a battery 502 as the voltage source and an ampere meter 504 as the current-detecting device. The auto-inspection mechanism may be used with any of the MEMS devices and may also include the components of FIG. 7, which is a circuit diagram showing an array of traces connected to mirrors and stoppers of MEMS devices.

The MEMS devices are arranged in an array of a display device, and are shown in simplified form. That is, each of the MEMS devices of FIG. 7 may be one of the MEMS device 101, the MEMS device 201, the MEMS device 401, the MEMS device 601, or another MEMS device incorporating one or more stoppers. A first MEMS device is represented by a mirror 751A, a hinge 752A, and stoppers 753A, 754A. A second MEMS device is represented by a mirror 751B, a hinge 752B, and stoppers 753B, 754B. A third MEMS device is represented by a mirror 751C, a hinge 752C, and stoppers 753C, 754C. A fourth MEMS device is represented by a mirror 751D, a hinge 752D, and stoppers 753D, 754D. While four MEMS devices are shown arranged in a 2×2 array, any number of MEMS devices may be arranged in arrays of different dimensions. When arranged in an array, the MEMS devices may share a common substrate and at least some inter-layer dielectrics to support respective mirrors and their electrical connections. They may also share the voltage source that provides the operating voltage described above.

Figure 7:
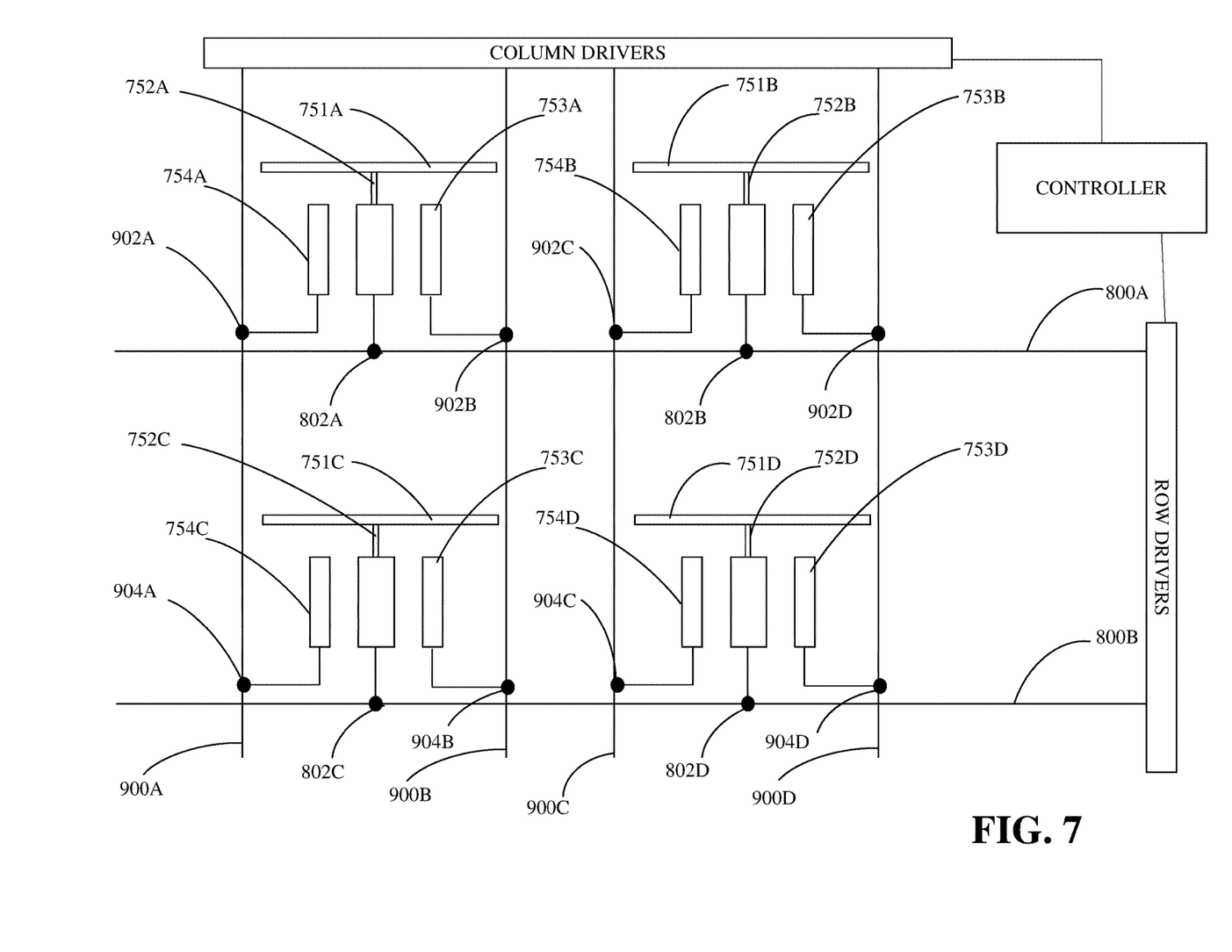
FIG. 7 is a circuit diagram showing an array of traces connected to mirrors and stoppers of MEMS devices herein arranged in an array of a display device.

The MEMS devices are electrically coupled to traces. In FIG. 7, traces in the form of word-lines 800A, 800B are connected to mirrors in a horizontal line (i.e., a row). Specifically, the mirrors 751A and 751B are connected to word-line 800A through respective nodes 802A and 802B, while the mirrors 751C and 751D are connected to word-line 800B through respective nodes 802C and 802D.

Traces in the form of bit-lines 900A, 900B, 900C, 900D are connected to stoppers in a column (i.e., vertical). Specifically, the stoppers 754A and 754C are connected to bit-line 900A through respective nodes 902A and 904A, the stoppers 753A and 753C are connected to bit-line 900B through respective nodes 902B and 904B, the stoppers 754B and 754D are connected to bit-line 900C through respective nodes 902C and 904C, and the stoppers 753B and 753D are connected to bit-line 900D through respective nodes 902D and 904D.

The word-lines 800A, 800B may be connected to row drivers to be individually addressable. Similarly, the bit-lines 900A, 900B, 900C, 900D may be connected to column drivers to be individually addressable. The column drivers and the row drivers may be connected to a controller. Although not shown expressly, the controller (or a separate controller) may be coupled to the voltage source and the current-detecting device of the auto-inspection mechanism 500 to time application of the voltage source and measurement by the current-measurement device. In the arrangement shown, the controller can address a column to couple the voltage source to a stopper of a MEMS device with the voltage source, and address a row to couple the current-detecting device to an associated mirror for the detection (and optionally the measurement) of leak current, if any. If the word-line is ground and the test voltage is applied to the bit-line for a particular combination of mirror and stopper of one of the MEMS devices, a current above a minimum value generally based on the sensitivity of the electronics can be observed between the bit-line and the word-line if the mirror in the pixel is stuck to the stopper. For example, if the word-line 800A is addressed, and the bit-line 900D is addressed so as to apply the test voltage, a detected current above the minimum value would indicate that the mirror 751B is stuck to the stopper 753B.

The auto-inspection mechanism 500, including the circuitry of FIG. 7 may perform this testing at different times and at different time intervals. The testing may be performed continuously. For example, each time a MEMS device is de-energized such that the mirror should be returning to the OFF state from the ON state, the testing may be performed after a defined time passes that allows for the mechanical spring action of the hinge to occur. The testing may be performed periodically. For example, a MEMS device may be tested after every 10th ON-OFF cycle.

The auto-inspection mechanism 500 in the illustrated example includes a direct current (DC) source, i.e., the battery 502. As a result, the leak current measured by the ampere meter 504 may be an absolute value of the leak current that is measured. Fluctuations in the leak current may also be measured by the auto-inspection mechanism 500 by repeating the measurements over time while the MEMS device is in the OFF state.

This mechanism can pin point the location of defects. While the stoppers are connected in a column, and the mirrors are connected in a row in this example, the opposite can occur. Further, the voltage source and the current-measurement device may be arranged so that the voltage source is coupled to the mirrors, and the current-measurement device is coupled to the stoppers. Other arrangements are also possible so that the MEMS devices may be separately identified for the occurrence of leak current. In some examples, the array may be modified so that more than one MEMS device is tested at the same time. That is, it is also possible to measure leak current for a row of MEMS devices, a column of MEMS devices, or both a row and a column of MEMS devices that form a portion of the MEMS display device. This can reduce test time when the display device comprises a large number of mirrors at the expense of not identifying an individual defective device in the tested group.

The traces and nodes of FIG. 7 may be formed on the substrate surface of the MEMS device, such as the substrate 111, 211. This electrical circuitry of the auto-inspection mechanism may be formed of any electrically conductive material, and may be connected to the mirrors and stoppers through metal layers and vias insulated using the inter-layer dielectrics as described with regards to FIGS. 1 to 3. The column drivers, row drivers, and controller may be mounted on a common substrate, or may be separately mounted.

Figure 8:
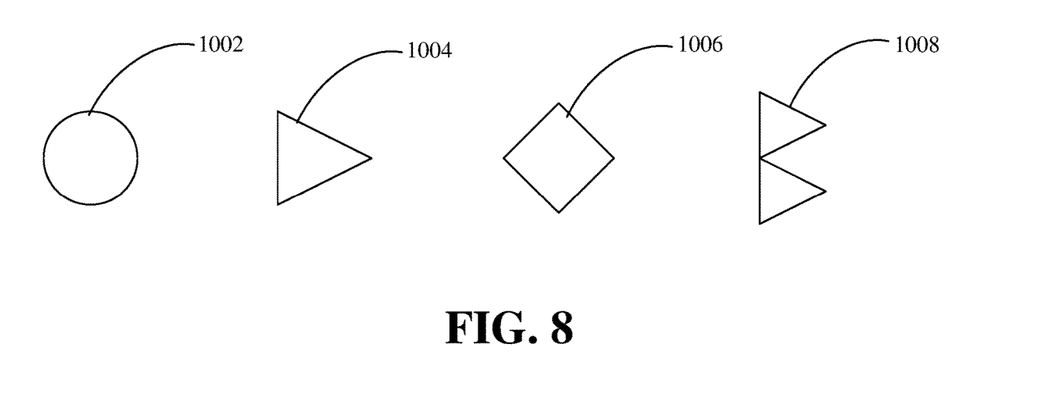
FIG. 8 shows examples of a cross-sectional view of stoppers that may be used according to the teachings herein.

In order to minimize the stiction force between a mirror and a stopper, the contact therebetween should be minimized. FIG. 8 shows examples of a cross-sectional view of the stoppers that may be used according to the teachings herein. In the examples shown, the stoppers 153, 154, 253, 254, 453, 454, 653, 654 are generally cylindrical, which has a circular cross-section 1002. This is useful, in part, due to ease of manufacture. However, because the mirrors 151, 251, 451, 651 are generally planar along their bottom (support, rear-facing, etc.) surface, a point contact will reduce contact between a mirror and a stopper. A triangular prism, for example, will provide a single point of contact where the prism is arranged such that a point of the triangular cross-section 1004 points to an outer peripheral edge of the MEMS device in line with the tilting direction of the mirror and the position of the stopper. For example, the stopper 654 formed of a triangular prism would have its triangular cross-section 1004 oriented as shown in FIG. 8, while the stopper 653 formed of a triangular prism would have its triangular cross-section 1004 oriented according to the mirror image of that shown in FIG. 8. Similarly, and while a cuboid having a square cross-section 1006 could be used, the cuboid would be arranged so that opposing corners point to respective outer peripheral edges of the MEMS device in line with the tilting direction of the mirror. For example, the stoppers 653, 654 each formed of a cuboid (or more generally a rectangular prism) would have their square (or diamond) cross-sections 1006 oriented as shown in FIG. 8. In contrast, rotating the cuboid could result in a mirror being in contact with an entire edge of the square cross-section 1006. Depending on the size of the mirror, more than one point of contact may be used. For example, two triangular prisms may have their edges aligned such that the resulting cross-section 1008 includes two points of contact when arranged in the same manner described above for a single triangular prism. Other variations in the shape of the stoppers are possible. That is, for example, a cross-sectional shape of the stopper may be a square, a circle, a triangle, a diamond, a dual triangle, etc.

A MEMS device having a mirror, a hinge, one or more stoppers, and electrodes enabling the mirror to move by an electrostatic force provided to the electrodes and to stop at a stopper can be inspected for defective pixels wherein the mirror is stuck to the stopper by an adhesive force. This adhesive force is called "stiction". Defective pixels of MEMS display devices are usually caused by stiction of a mirror to a stopper. If the mirror and the stopper are isolated electrically, the contact between the mirror and the stopper can be checked by applying a voltage and checking for a current. The exact location can be found if the mirrors on a line are connected to a word-line and the stoppers in a column are connected to a bit-line and the leak current between the bit-line and the word-line is observed.

Although the present invention has been described in terms of certain embodiments, it is to be understood that such disclosure is not to be interpreted as limiting. Various alterations and modifications will become apparent to those skilled in the art after reading the disclosure. Accordingly, it is intended that the appended claims be interpreted as covering all alternations and modifications that fall within the scope thereof.

What is claimed is:

1. A Micro-Electro-Mechanical Systems (MEMS) device, comprising:
 a substrate;
 an electronic circuit mounted on the substrate;
 a movable element mounted on the substrate whose movement is controlled by application of an operating voltage by the electronic circuit;
 a stopper mounted on the substrate that stops the movement of the movable element through mechanical contact of the stopper with the movable element;
 an auto-inspection mechanism, mounted at least in part on the substrate, that applies a test voltage between the movable element and the stopper and determines whether or not a leak current is present; and
 an insulating layer between the movable element and the auto-inspection mechanism, wherein the insulating layer comprises vias connecting components above the insulating layer to the auto-inspection mechanism.

2. The MEMS device of claim 1, wherein the movable element is a mirror mounted on a hinge, and a back side of the mirror facing the stopper has a light absorbing coating.

3. The MEMS device of claim 1, wherein the stopper and the movable element are electrically isolated before the auto-inspection mechanism applies the test voltage.

4. The MEMS device of claim 1, wherein the insulating layer is made of at least one of silicon, alumina, or Aluminum nitride.

5. The MEMS device of claim 1, wherein the stopper is made of at least one of Tungsten, Copper, Silicon, Titanium, or Titanium-Nitride.

6. The MEMS device of claim 1, wherein the movable element is a mirror mounted on a hinge, and a distance between the stopper and the hinge is less than one-half a distance between the hinge and an outer peripheral edge of the mirror.

7. The MEMS device of claim 1, wherein a yield strength of a material of the stopper is larger than a stress applied to the movable element when the movable element contacts the stopper.

8. The MEMS device of claim 1, wherein a cross-sectional shape of the stopper is a square, a circle, a triangle, a diamond, or a dual triangle.

9. The MEMS device of claim 1, wherein the auto-inspection mechanism measures the leak current continuously or periodically.

10. The MEMS device of claim 1, wherein the auto-inspection mechanism measures fluctuations in the leak current.

11. The MEMS device of claim 1, wherein the auto-inspection mechanism measures an absolute value of the leak current.

12. A Micro-Electro-Mechanical Systems (MEMS) device, comprising:
 a substrate;
 a plurality of electronic circuits mounted on the substrate;
 a plurality of movable elements mounted on the substrate and arranged in an array, each of whose movement is controlled by application of an operating voltage by a respective electronic circuit of the plurality of electronic circuits;

a plurality of stoppers mounted on the substrate, each stopper of the plurality of stoppers associated with a respective movable element to stop the movement of the movable element through mechanical contact of the stopper with the movable element; and an auto-inspection mechanism, mounted at least in part on the substrate, that applies a test voltage between at least one of the plurality of movable elements and an associated stopper and determines whether or not a leak current is present, wherein the auto-inspection mechanism comprises:

a plurality of traces arranged in an array on the substrate and configured to be coupled to a voltage source and an ampere meter, the plurality of traces comprises a plurality of word-lines and to a plurality of bit-lines, each of the plurality of movable elements is electrically coupled to one of a word-line of the plurality of word-lines or a bit-line of the plurality of bit-lines, and each of the plurality of stoppers is electrically coupled to the other of a word-line of the plurality of word-lines or a bit-line of the plurality of bit-lines.

13. The MEMS device of claim 12, wherein the auto-inspection mechanism comprises:
the voltage source that applies the test voltage; and
the ampere meter that measures a value for the leak current.

14. The MEMS device of claim 13, wherein the plurality of word-lines is arranged parallel to the plurality of bit-lines, and each of the plurality of word-lines and each of the plurality of bit-lines is individually addressable by a controller.

15. The MEMS device of claim 12, wherein the plurality of movable elements comprises a plurality of mirror elements, and the auto-inspection mechanism measures the leak current for a row of mirror elements, a column of mirror elements, or both a column and a row of mirror elements.

16. The MEMS device of claim 12, wherein the test voltage is lower than the operating voltage.

* * * * *